US009576090B2

(12) United States Patent
Ryzhyk et al.

(10) Patent No.: US 9,576,090 B2
(45) Date of Patent: Feb. 21, 2017

(54) CO-DESIGN OF A TESTBENCH AND DRIVER OF A DEVICE

(75) Inventors: Leonid Ryzhyk, Eveleigh (AU); Gernot Heiser, Eveleigh (AU)

(73) Assignee: NATIONAL ICT AUSTRALIA LIMITED, Eveleigh, NSW (AU)

( * ) Notice: Subject to any disclaimer, the term of this patent is extended or adjusted under 35 U.S.C. 154(b) by 865 days.

(21) Appl. No.: 13/579,683

(22) PCT Filed: Feb. 14, 2011

(86) PCT No.: PCT/AU2011/000154
§ 371 (c)(1),
(2), (4) Date: Sep. 10, 2012

(87) PCT Pub. No.: WO2011/100785
PCT Pub. Date: Aug. 25, 2011

(65) Prior Publication Data
US 2013/0007330 A1    Jan. 3, 2013

(30) Foreign Application Priority Data

Feb. 19, 2010 (AU) ............................ 2010900663
Jul. 26, 2010 (AU) ............................ 2010903329

(51) Int. Cl.
| | | |
|---|---|---|
| G06F 13/14 | (2006.01) |
| G06F 9/44 | (2006.01) |
| G06F 11/00 | (2006.01) |
| G06F 13/00 | (2006.01) |
| G06F 3/00 | (2006.01) |
| G06F 9/46 | (2006.01) |

(Continued)

(52) U.S. Cl.
CPC ....... *G06F 17/5022* (2013.01); *G06F 11/3664* (2013.01)

(58) Field of Classification Search
CPC ... G06F 11/3664; G06F 11/079; G06F 11/263; G06F 11/3684; G06F 11/3688; G06F 11/273
USPC ...... 710/305; 717/124; 714/37; 719/321, 327
See application file for complete search history.

(56) References Cited

U.S. PATENT DOCUMENTS 5,867,710 A * 2/1999 Dorris et al. ................. 717/124
6,041,363 A * 3/2000 Schaffer ............... G06F 9/44521
714/E11.211

(Continued)

OTHER PUBLICATIONS

Written Opinion of the International Searching Authority, completion date: Apr. 15, 2011; 5 pages.

(Continued)

*Primary Examiner* — Faisal M Zaman

(57) ABSTRACT

This disclosure concerns the co-design of a testbench (100) and driver (102) of a device. It is an advantage in at least some embodiments that it improves driver reliability and reduces development cost. It does this by re-using the device functional layer (70) that is dependent on the device class but independent of the specific device and specific operating system (OS) of the driver. The device functional layer (70) is re-used as it is implemented in the device's testbench (100) and also as the core part of the device (driver (102). A scenario layer (68) is also used that is able to test the generic device interface (72) and device functional layer (70) in the testbench (100) environment, and the testing includes testing for responses to OS requests. This helps provide more exhaustive testing.

18 Claims, 8 Drawing Sheets

(51) Int. Cl.
*G06F 17/50* (2006.01)
*G06F 11/36* (2006.01)

(56) References Cited

U.S. PATENT DOCUMENTS

| | | | | |
|---|---|---|---|---|
| 6,243,833 B1* | 6/2001 | Hitchcock | ............ | G06F 11/2215 714/33 |
| 6,393,495 B1* | 5/2002 | Flory | ................. | G06F 9/44521 719/327 |
| 6,754,763 B2* | 6/2004 | Lin | .................... | G06F 15/7864 361/748 |
| 6,868,545 B1 | 3/2005 | Devins et al. | | |
| 7,222,349 B1* | 5/2007 | Krinke et al. | ................. | 719/327 |
| 7,571,414 B2* | 8/2009 | Huang | ................ | G06F 17/5045 716/138 |
| 7,725,205 B1* | 5/2010 | Krebs | ............................ | 700/96 |
| 8,386,758 B1* | 2/2013 | Mitchell | ............... | G06F 9/4411 710/10 |
| 2001/0037301 A1* | 11/2001 | Shepley et al. | ................. | 705/43 |
| 2002/0004852 A1* | 1/2002 | Sadovsky et al. | ............ | 709/321 |
| 2002/0152456 A1* | 10/2002 | Nightingale | ........ | G06F 17/5022 717/135 |
| 2006/0004559 A1* | 1/2006 | Gladfelter | ............... | G06F 9/455 703/26 |
| 2006/0080636 A1 | 4/2006 | Hsieh | | |
| 2006/0242525 A1* | 10/2006 | Hollander | ........ | G01R 31/31704 714/742 |
| 2007/0143586 A1* | 6/2007 | Miyake | ................... | G06F 8/665 713/1 |
| 2007/0233775 A1 | 10/2007 | Jackson et al. | | |
| 2008/0021667 A1* | 1/2008 | Aiwazian | ........... | G05B 23/0229 702/117 |
| 2008/0270996 A1* | 10/2008 | Choi et al. | .................... | 717/129 |
| 2009/0158257 A1* | 6/2009 | Xu | ........................ | G06F 11/362 717/129 |
| 2010/0153924 A1* | 6/2010 | Andrews | ............. | G06F 11/3688 717/126 |
| 2015/0095712 A1* | 4/2015 | Han | ............................... | 714/42 |

OTHER PUBLICATIONS

International Search Report, completion date: Apr. 15, 2011; 2 pages.
Preliminary Report on Patentability, completion date: Dec. 15, 2011; 6 pages.
Bombieri, N., Fummi, F., Pravadelli, G. & Vinco, S. 2009. *Correct-by-Construction Generation of Device Drivers Based on RTL Testbenches*. Design, Automation & Test in Europe Conference & Exhibition, Apr. 20-24, 2009.
Ryzhyk, L. , Chubb, P., Kuz, I. , Le Sueur, E.and Heiser, G. *Automatic Device Driver Synthesis with Termite*. 2009. Proceedings of the ACM SIGOPS 22nd symposium on Operating systems principles, Oct. 11-14, 2009.

* cited by examiner

```
task tx_packet (packet);
  tx_queue.push_back (packet);
  drv.send (packet);
endtask task tx_frame (frame);
  assert (frame_cmp(tx_queue[0],frame)==1);
  tx_queue[0].complete = 1;
endtask task send_complete ();
  assert (tx_queue[0].complete == 1);
  tx_queue.pop_front;
endtask
```

Fig. 4

CO-DESIGN OF A TESTBENCH AND DRIVER OF A DEVICE

CROSS-REFERENCE TO RELATED APPLICATIONS

The present application claims priority from Australian provisional patent applications No. 2010903329 and No. 2010900663 the content of which is incorporated herein by reference.

TECHNICAL FIELD

This disclosure concerns the co-design of a testbench and driver of a device. A testbench is technical field of a hardware verification engineer, whereas a device driver is the technical field of a software developer. Aspects of the invention include a device driver, a computer system, a test bench, a method of constructing a device driver, and also software and a computer system.

BACKGROUND ART

Device drivers are critical components of an operating system (OS), as they are the software that controls peripheral hardware, such as disks, network interfaces or graphics displays. They make up a large fraction of OS code, for example around 70% in Linux.

Drivers are the leading reliability hazard in modern OSs. Drivers are known to be responsible for the majority of OS failures, and have been shown to have three to seven times the defect density of other OS code. The leading class of driver defects, comprising about 40% of all driver bugs, are related to incorrect handling of the hardware-software interface. These device hardware-software interface bugs include incorrect use of device registers, sending commands to the device in the wrong order, or incorrectly interpreting device responses.

Hardware developers define the software interface of the device and map it down to the low-level hardware design. This design is thoroughly tested by the hardware verification team to make sure that it correctly implements the required interface before transferring it to silicon. The focus in this process is on ensuring hardware correctness. Driver support is a secondary concern to hardware engineers.

Since mistakes are expensive and time consuming to fix once the design has been synthesised in silicon, much effort is put into initially testing/verifying the design in a simulated environment called a 'testbench' prior to producing hardware.

There exists several approaches to structuring the device testbench. The majority of modern testbenches follow the layered structure shown in FIG. 1(a) which models the hardware and software structure of a real computer. The testbench is built around the register transfer level (RTL) model of the device, also known as the design under test (DUT) 30. This is the RTL design being verified. The DUT 30 is connected to a functional model (BFM) 32 that simulates the I/O bus the device is connected to. It accepts bus read and write commands from higher layers and translates them into bus transactions at the device interface.

The agent module 34 consists of functions and associated state that implement high-level device transactions such as sending network packets, changing device configuration, interrupt handling, etc.

The scenario layer 36 consists of test scenarios designed to thoroughly test the device in various modes. These scenarios can be directed or randomised. A directed scenario consists of a fixed sequence of commands, whereas a randomised scenario generates random command sequences subject to a set of constraints.

Finally, the bottom layer 38 of the testbench simulates the physical medium that the device controls. For instance, if the DUT is an Ethernet MAC controller, this layer simulates an Ethernet PHY chip. In addition to the above components, a complete testbench contains other modules (not shown), including monitors, scoreboards, and coverage points that check whether the device behaves correctly during tests and whether the tests have covered the entire device functionality.

FIG. 1(b) shows the OS architecture of the operating system's I/O stack. The hardware device 42 is a hardware device that enables a computer system to communicate with the outside world. Examples of I/O devices 42 include human-interface devices, e.g., keyboards and mice, which enable communication with a human operator, networking devices, e.g., Ethernet controllers, which enable communication between different computer systems, and storage devices, e.g., hard disk drives or CDROM drives, which allow the computer system to store data on non-volatile media.

The hardware device 42 is connected to the physical medium 44 and an I/O bus that is a hardware subsystem that transfers data between the central processing unit (CPU) of a computer system and I/O devices 42.

The I/O bus transport is part of the OS that enables device drivers 46 to communicate with the devices connected to the I/O bus.

A device driver 46 is a component of the OS that is responsible for controlling an I/O device 42. It provides services to the rest of the OS 50 and relies on services provided by the bus transport layer 60.

In order to enable the software driver team to produce a driver for the device, hardware designers provide a document, known as the device datasheet, that describes device registers and behaviour from the software perspective. Since driver developers usually do not have access to hardware design internals nor the expertise required to analyse them, they are bound to rely on the datasheet and personal communication with the hardware team in their work. In practice, datasheets are often incomplete and inaccurate, which results in numerous driver defects.

Another problem that driver developers face is the complexity of testing the driver. While the driver can issue arbitrary commands to the device, it only has partial control over its physical environment, including the I/O bus and the external medium that the device is connected to. This makes thorough testing difficult to achieve. For instance, testing how the driver handles internal device FIFO overflow due to bus contention or packet transmission failure due to multiple network collisions is difficult in practice. As a result, most drivers are only well tested in common scenarios and do not adequately handle various corner cases.

Any discussion of documents, acts, materials, devices, articles or the like which has been included in the present specification is solely for the purpose of providing a context for the present disclosure. It is not to be taken as an admission that any or all of these matters form part of the prior art base or were common general knowledge in the field relevant to the present disclosure as it existed before the priority date of each claim of this application.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

SUMMARY

In a first aspect, there is provided a device driver of a device comprising:
a generic device interface to an operating system (OS) that defines the input/output and configuration operations that are supported by the device, wherein the generic device interface is independent of the OS and independent of the specific device; and
a functional layer that implements the input/output and configurations defined by the generic device interface, wherein the functional layer is dependent on the specific device.

It is an advantage in at least some embodiments that it improves driver reliability and reduces development cost. It does this by re-using the generic device interface implementation as part of the device testbench as the core part of the device driver.

The generic device interface may be dependent on the class of devices that the device belongs to, in that it defines the input/out and configuration operations that are supported by substantially all devices of the specific device's device class. Since the generic device interface is suitable for use with all device drivers of the same class, it increases efficiency as it need only be constructed once for each device class.

The device driver may further comprise:
a generic bus interface to a bus transport framework and functional layer that defines the methods of access to the bus framework, wherein the generic bus interface is independent of the OS. The generic bus interface may be independent of the specific bus used by the device.

The device driver may further comprise:
an OS wrapper to interface to the operating system and the generic device interface that translates instructions between them. The OS wrapper is dependent on the specific OS and independent of the specific device.

The device driver may further comprise:
a bus wrapper to interface to a bus framework interface and the generic bus interface that translates instructions between them. The bus wrapper may be dependent on the specific OS and independent of the specific device.

The functional layer may substantially be the same as or a translation of a functional layer used in a testbench for the specific device.

The generic device interface may substantially be the same as or a translation of the generic driver interface used in a testbench for the specific device.

The generic bus interface may substantially be the same as or a translation of the generic bus interface used in a testbench for the specific device.

The device may be a peripheral hardware device.

The device driver may be comprised of computer readable instructions stored on computer readable medium.

In a second aspect there is provided a computer system comprising:
a device;
memory to store an executable version of the device driver of the first aspect described above; and
a processor to execute the executable version of the device driver to support the use of the device by the computer system.

In a third aspect there is provided a testbench of a device comprising:
a generic device interface to an operating system (OS) that defines the input/output and configuration operations that are supported by the device, wherein the generic device interface is independent of the OS and independent of the specific device; and
a functional layer that implements the input/output and configuration operations defined by the generic device interface, wherein the functional layer is dependent on the specific device.

The test bench also includes the generic bus interface as described above. The generic device interface, functional layer and generic bus interface of this testbench may be substantially the same as or a translation of components used in a device driver for the specific device.

The testbench may further comprise a scenario layer which defines a valid sequence of requests that can be made to the functional layer and corresponding correct responses to the requests, wherein the set of requests are independent of the specific device and dependent on the device class. The set of requests comprises a contract for the device class. The request may be made through the generic device interface.

In a fourth aspect there is provided a method for testing a design of a device in a testbench (verifying a test bench design for a device) comprising:
applying a sequence of requests to a functional layer that implements the input/output and configuration operations defined by a generic device interface of the device, wherein the functional layer is dependent on the specific device and the generic device interface is independent of the operating system (OS) and independent of the specific device; and
assessing the responses to the requests for correctness.

The requests may be OS requests. In this way, the functional layer is tested for correctness before migrating to the OS environment.

The requests are independent of the specific device and dependent on the class of devices that the device belongs to.

The sequence of requests may also be applied to the generic device interface and the bus wrapper described above.

In a fifth aspect there is provided a method for constructing a device driver comprising:
receiving or accessing a generic device interface to an operating system (OS) that defines the input/output and configuration operations that are supported by the device, wherein the generic device interface is independent of the OS and independent of the specific device;
receiving or accessing a functional layer that implements the input/output and configuration operations defined by the generic device interface, wherein the functional layer is dependent on the specific device;
constructing the device driver that includes the generic device interface and the functional layer.

The functional layer may not be in the language suitable for use in the device driver, and in this case translating the functional layer to the appropriate language.

The method may further comprise:
receiving or accessing a generic bus interface to the bus transport framework and functional layer that defines the methods of access to the bus framework, wherein the generic bus interface is independent of the OS and independent of the specific bus; and
the constructing step further comprising including the generic bus interface in the device driver.

The method may further comprise:
receiving or accessing a bus wrapper to interface to the bus framework interface that is specific to the OS and the generic bus interface that translates instructions between them; and
the constructing step further comprising including the bus wrapper in the device driver.

The method may further comprise:
receiving or accessing an OS wrapper to interface to the operating system and the generic device interface that translates instructions between them; and
the constructing step further comprising including the OS wrapper in the device driver.

The method may further comprise:
receiving or accessing an updated functional layer based on results of tests on the functional layer in the testbench; and
the constructing step further comprising including the updated functional layer in the device driver.

There results of test on the functional layer are acquired performing the method of testing according to the fourth aspects described above.

Figure 1A:
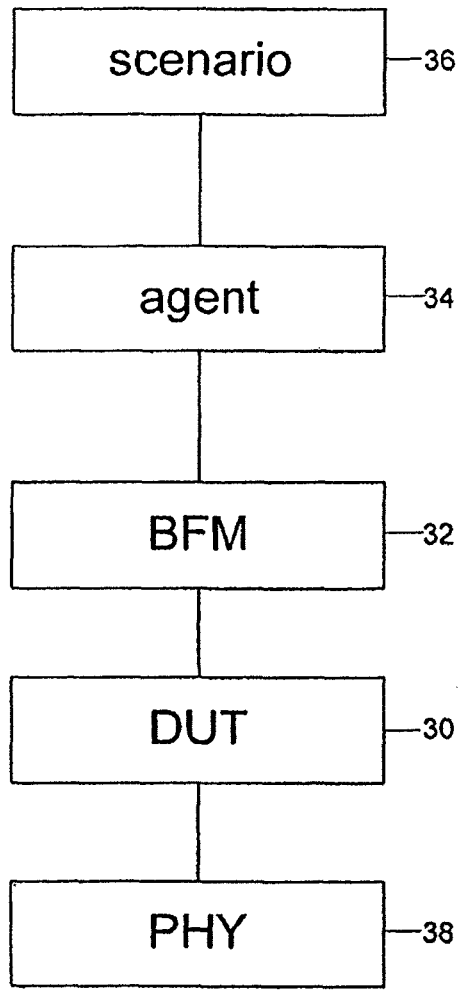
FIG. 1(a) schematically shows the conventional testbench environment.
Figure 1B:
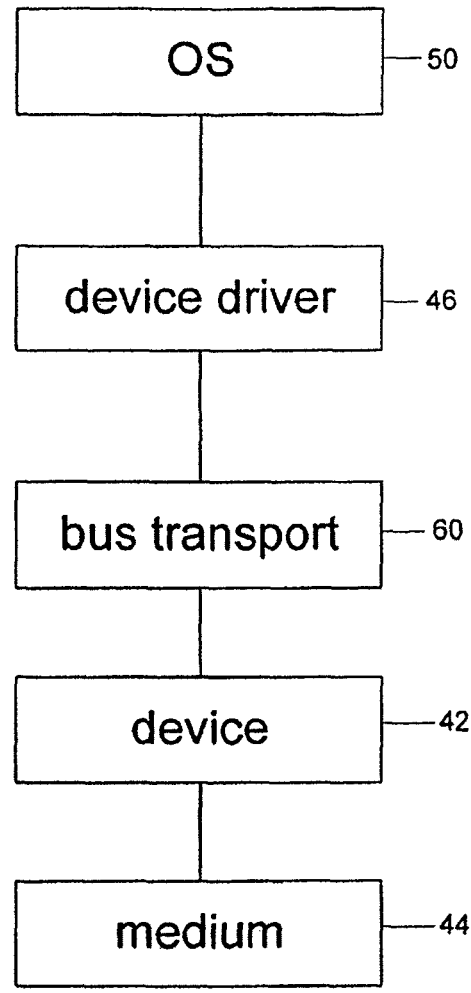
FIG. 1(b) schematically shows the conventional OS I/O stack environment.
Figure 2:
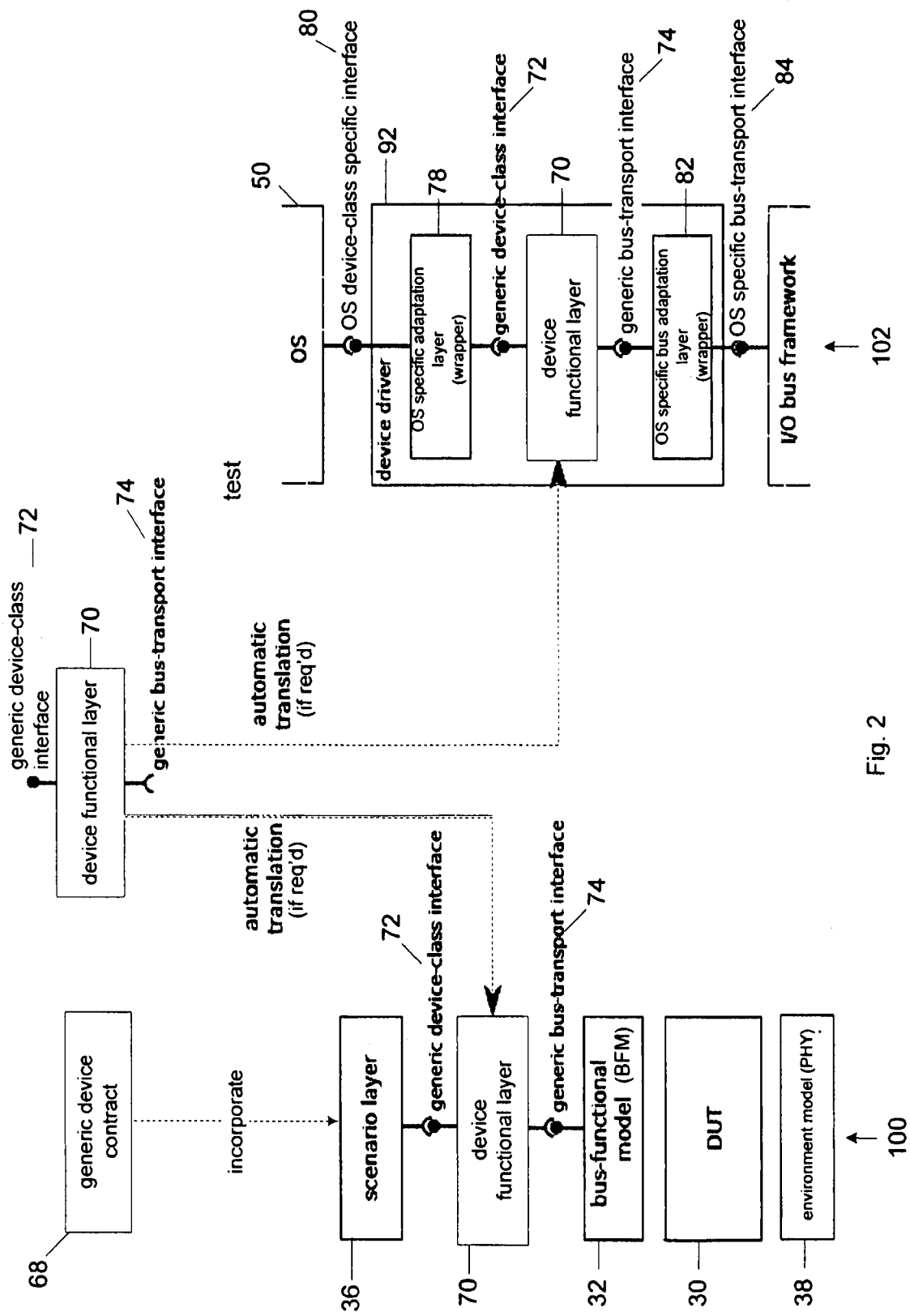
Figure 3A:
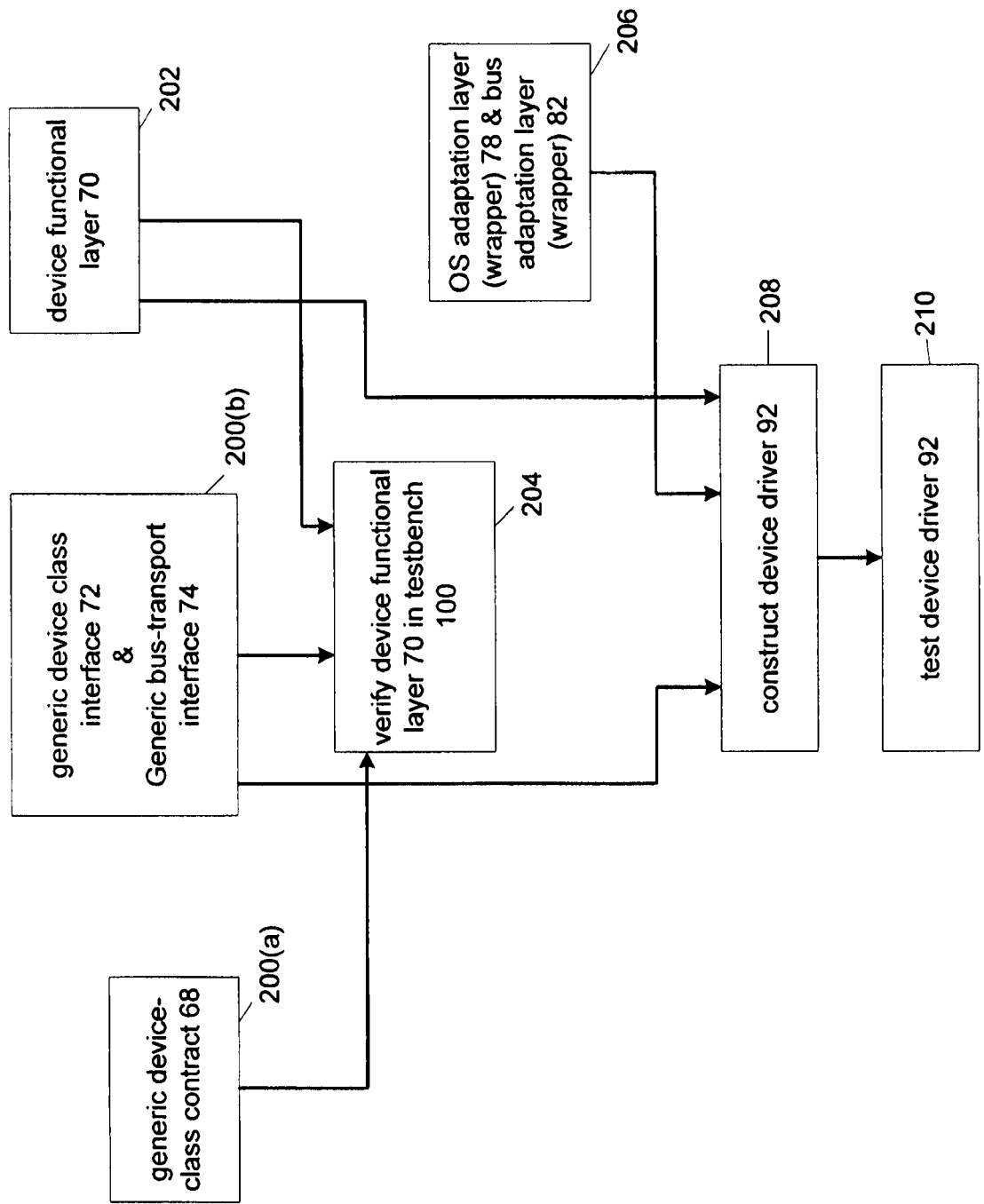
Figure 3B:
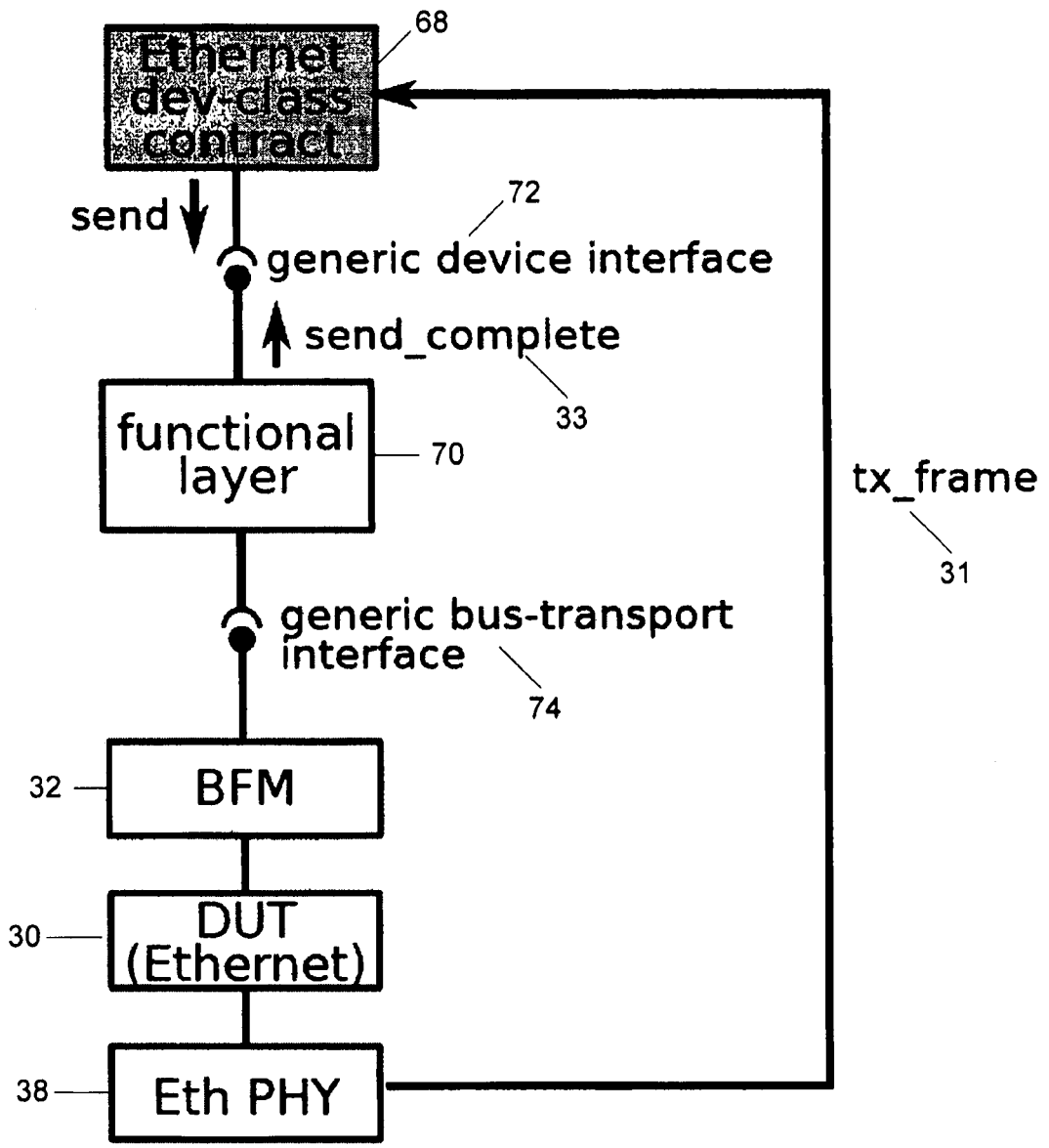
Figure 5:
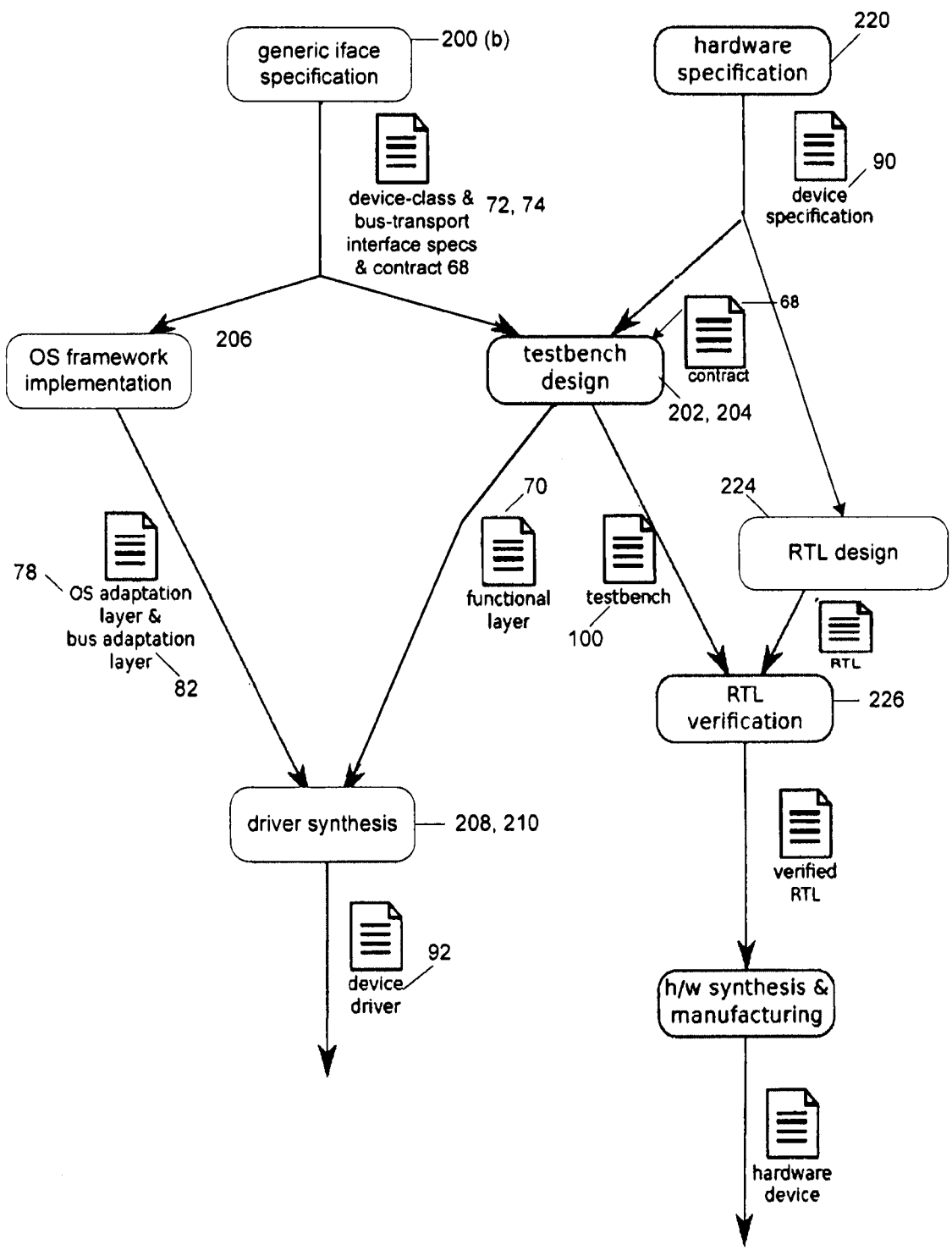
Figure 6:
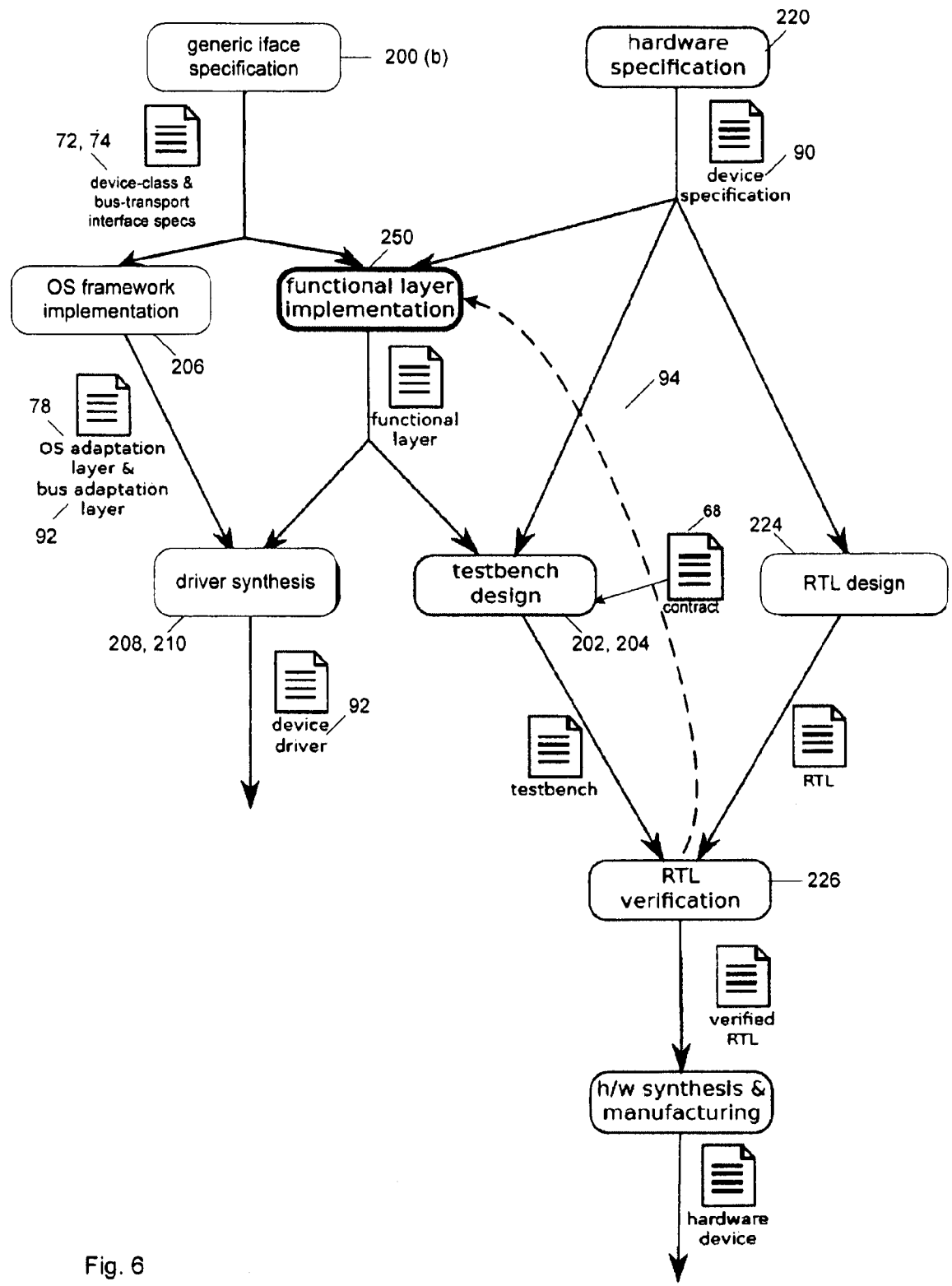

Examples will now be described with reference to the accompanying drawings in which:

FIG. 2 schematically shows the testbench and OS environment of Example 1;

FIG. 3(a) is a flow diagram of the device driver design of Example 1;

FIG. 3(b) schematically shows the Ethernet controller testbench set up to test the generic driver for contract compliance of Example 1;

FIG. 4 is a fragment of the Ethernet controller device-class contract of Example 1;

FIG. 5 is a flow diagram of the device-driver design of Example 2;

FIG. 6 is a flow diagram of the device-driver design of Example 3; and

Figure 7:
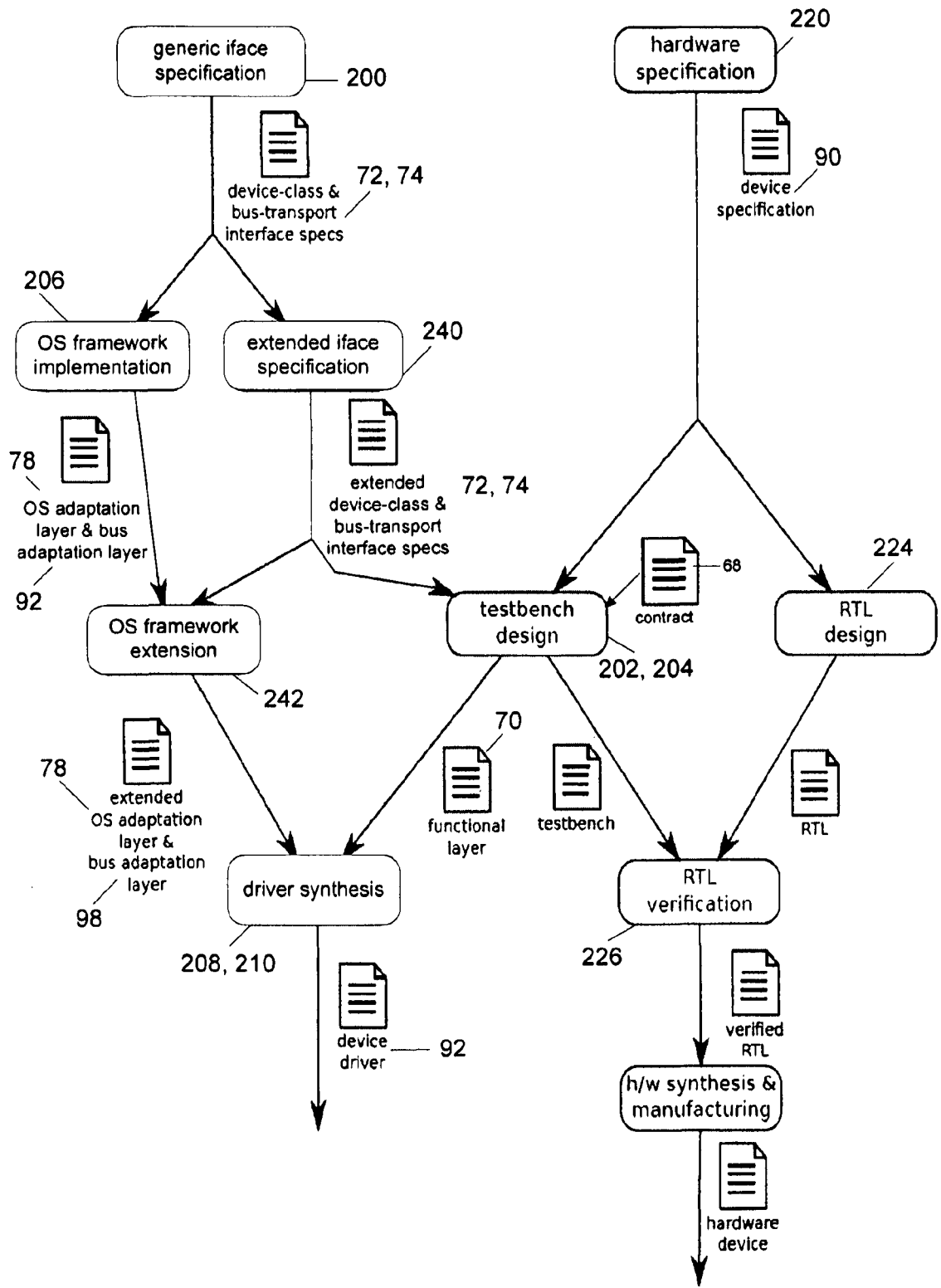

FIG. 7 is a flow diagram of the device-driver design of Example 4.

BEST MODES

Our analysis of many open source drivers identified that defects in device drivers can often be attributed to a disconnect between the developers of the hardware (device) and software (driver).

To address this, the example here integrates driver development in both the hardware design and verification flow. In particular, we observe that the task of writing a device driver is similar to the task that verification engineers carry out when building a test harness, that is testbench, for the device. The purpose of such a testbench is to test the device under a wide range of operating conditions. To this end, the testbench incorporates the agent module consisting of a set of functions that control various high-level device operations and can be combined into more complex test scenarios. For example, the agent of a network controller device testbench contains functions to initialise and configure the device, send and receive network packets, etc. This is essentially the same functionality that a device driver must provide to the OS.

The aim is to reuse this, functionality to construct a driver for the device, which will reduce the driver development cost and lead to more reliable drivers.

(1) Firstly, hardware verification engineers have complete access to all device specifications and design internals and the expertise to understand these specifications. As such, they are in a better position to implement correct device control functions than driver developers.

(2) Secondly, device control functions can be tested in the context of the device testbench more exhaustively than in the context of a driver. The testbench is specifically designed to expose various corner cases in the device behaviour. It is built around a simulated model of the device and has complete control over all components of the simulated environment. For instance, it can model bus contention, network collisions, and other unusual situations. As a side effect, such testing also exposes defects in other testbench components, including the agent, since such defects are likely to cause failures in verification scenarios.

In practice, existing testbench code cannot be easily reused in a device driver. We have also identified that while the agent and the driver serve a similar purpose in their respective environments, the exact interfaces they implement are different.

Adapting the agent implementation to the device driver interface enforced by a particular OS may require significant modifications, e.g., splitting one operation into several or adding calls to OS-specific services, as well as writing glue code to translate OS requests to agent functions. Furthermore, some of the implicit assumptions incorporated in the agent code may not hold in the OS environment. The OS may invoke driver functions in a different order than the testbench or run operations designed for a single-threaded context concurrently. As a result, the driver based on this code will contain defects even though it was thoroughly tested in the testbench environment.

Example 1

Instead of trying to adapt existing testbench code to work in the OS environment, in this example a codesign approach is taken where both the driver and the testbench are designed for code sharing.

To this end and referring to FIG. 2, we define a detailed interface 72 between device control functions and their client, be it a testbench 100 or an OS 102 known as a generic-device class interface or generic device interface. We also associate a detailed behavioural contract 68 with this interface 72. We call a set of device control functions that comply with the interface 72 and the contract 68 (not shown) for a particular device a functional layer 70, which can attract many different descriptive labels such device programming model, environment independent, functional device controls of a device driver or portable layer. The contract 68 is written as an imperative program that randomly generates all valid sequences of requests to the device functional layer 70 and checks its responses against predicted outcomes. This imperative program 68 can be incorporated into the device testbench 100 as one of the testing scenarios 36, which allows checking the functional layer's compliance 70 with the contract 68 before migrating the functional layer 70 to the OS environment 102.

Specifying a driver interface 72 and the associated contract 68 is a complicated task. Fortunately, it only needs to be performed once for a 'class' of similar devices that share the same contract 68, e.g., Ethernet controllers or SCSI adapters.

In order to use a device functional layer 70 and the generic device-class interface 72 in the OS environment 102, one must provide a OS wrapper 78 to translate between the OS specific device-class interface 80 and the generic device-class interface 72. This wrapper 78 only needs to be implemented once for each OS 50 and each device class.

Testbenches 100 are implemented in hardware description and verification languages (HDVLs) such as SystemC and SystemVerilog, whereas many OS kernels can only host code written in C or C++. One possible solution is to automatically translate the device functional layer 70 from HDVL to C for use in the testbench environment 100. Another approach is to write generic drivers in C and incorporate them in an HDVL testbench using inter-language bindings. This example can be used with both of these alternatives.

In summary, the proposed co-design methodology of Example 1 consists of the following steps as shown in FIG. 3(*a*):

- 200(*a*) & (*b*) Generic device-class interfaces 72 and associated contracts 68 are defined for various device classes. Also generic bus-transport interfaces 74 for various types of I/O bus (e.g., PCI, USB, etc) are developed.
- 202 A device functional layer 70 is implemented for a particular device.
- 204 The device functional layer 70 is verified in the context of the device testbench 100 for that device using the generic device-class contract 68 as one of the testing scenarios.
- 206 An OS wrapper 78 and bus adaptation layer 82 are implemented for the target OS 102, the given generic device-class interface 72 and the given generic bus-transport interface 74.
- 208 Then for each specific device, the device functional layer 70 is translated into C or C++ and combined with the interfaces 72, 74 and wrappers 78, 82 to form a complete device driver 92.
- 210 Then for each specific device, final driver testing is performed in the OS environment 102.

Steps 200 and 206 are performed for each device class so do not need to be repeated if performed previously (although step 206 is specific to an OS). Steps 202, 204, 208 and 210 are performed for each specific device.

The driver 92 is stored in executable form in computer memory. A processor functionally connected to the hardware device executes the driver 92 to control the respective hardware device.

Often the driver is provided with the hardware device, for example when purchased separately.

This methodology of Example 1 relies on testbenches 100 utilising interfaces 72 and 74. This approach is a practical for the following reasons.

(1) First, driver reliability is an increasingly important concern for hardware vendors, especially in the embedded space where short product development cycles put extra pressure on engineers to produce reliable drivers within a short time frame. Our approach allows implementing and testing driver code even before the device has been implemented in silicon.

(2) Second, while introducing only minor changes to the verification workflow, the co-design methodology improves the quality of hardware verification. By testing the device functional layer 70 for adherence to the contract 68, we simultaneously test the device under a wide range of scenarios that model how the device will be used in a real OS. The effectiveness of this approach has been demonstrated in the below where a number of design errors in the device were found which had slipped through conventional verification.

Referring back to FIG. 2, the following description of the various elements shown is provided as follows:

- A device-class is a set of all I/O devices that provide similar service. For example, all Ethernet controller devices support sending and receiving of Ethernet packets and therefore belong to the same class. As another example, all USB host controller device implement a service that allows the host CPU to communicate with devices on the USB bus and therefore also belong to the same device class.
- The generic device-class interface 72 defines I/O and configuration operations that any device of the given class must support. This interface is both device-independent and OS-independent. Device independence means that this interface captures common properties of the device-class and does not rely on any device-specific features. OS independence means that this interface does not make any assumptions about the specific OS in which it is being implemented and does not rely on OS-specific data structures or operations.
- The generic bus-transport interface 74 describes the service provided by a particular type of I/O bus, e.g., PCI or WishBone. This interface is also OS-independent.
- The device functional layer 70 implements I/O and configuration operations defined in the generic device-class interface 72. It does so by translating requests received through the generic device-class interface 72 into sequences of interactions with the device via the generic bus-transport interface 74.
- The OS adaptation layer (wrapper) 78 performs the translation between the OS-specific device class interface 80 and the generic device-class interface 72.
- The bus adaptation layer (wrapper) 82 performs the translation between the OS-specific bus transport interface 84 and the generic bus-transport interface 74.
- The OS-specific device-class interface 80 defines I/O and configuration operations that must be implemented by all drivers for devices of the given class in the particular OS.
- The OS-specific bus transport interface 84 describes the service that the particular OS provides for device drivers to communicate with devices on the bus.

To further explain this example it should be noted that the device is managed by device functional layer 70, which interacts with the environment via two standardised interfaces the device-class interface 72 shared by all similar devices, and the generic bus-transport interface 74 that provides generic methods for access to a specific bus type (PCI, USB, etc).

A generic device-class interface specification 72 consists of two parts. The first part declares methods that a device programming model must implement and environment callbacks that the device programming model can use. The second part specifies the behavioural contract associated with the interface. It defines constraints on the ordering of driver requests and responses as well as operations that the device must complete to satisfy each request.

A generic bus-transport interface specification 74 declares methods that the OS bus-transport layer 82 must implement and callbacks that the device functional layer 70 must provide.

The following is a simplified example of a constraint defined by the Ethernet controller device-class contract:
  When the controller is enabled, the client can call the packet transmission method of the driver.
  The driver must transmit packets received from the client over the network in FIFO order.
  Once a packet has been transmitted, the driver must notify the client by invoking the packet completion callback.

The first part of this rule constrains the ordering of requests that the driver must handle: a transmit request can only arrive after the controller has been enabled. The second part specifies the semantics of the transmit request: transmitted packets must appear at the PHY interface of the controller in the same order they were received from the client. The third sentence describes how the driver must notify the client about request completion.

In order to facilitate the testing of generic drivers for contract compliance, we formulate the contract 68 as an imperative program that can be incorporated in the device testbench as one of the testing scenarios 36. This program represents the most general contract-compliant environment that is capable of issuing all legal sequences of driver requests. It generates random requests to the driver 92 according to the constraints of the contract 68 and checks the driver 92 behaviour for adherence to the contract 68.

Contract 68 based testing has important advantages compared to conventional driver testing. First, by randomly generating sequences of driver 92 requests, it achieves a high degree of program coverage. Second, being integrated in the testbench 100, the contract 68 can monitor not only driver responses but also device outputs and internal hardware signals. This allows it to check that requests sent to the driver result in correct device behaviours. This enables much higher degree of confidence than conventional driver testing.

This is illustrated in FIG. 3(*b*) which shows an example testbench for an Ethernet MAC controller device including the contract module 68. In this setup, the PHY module notifies the contract module 68 about events observed at the PHY interface of the controller, e.g., when the controller sends or receives an Ethernet frame. These notifications are essential to checking whether the functional layer 70 and generic device interface complies with protocol constraints, including the one described above. The corresponding fragment of the contract module is shown in FIG. 4.

The contract 68 is written in SystemVerilog, which is the language of choice for most modern testbenches. Among other features, it provides expressive constructs for describing constrained-random behaviours, which makes it attractive for specifying device-class contracts. The tx packet method is called internally by the contract module to transmit a randomly generated packet on the network. It stores a copy of the packet in the internal transmit queue for future reference and issues a send request to the driver. When the PHY module receives a complete Ethernet frame from the controller, it calls the tx frame 31 callback of the contract module 68. This callback verifies that the transmitted frame is identical to the frame at the head of the internal transmit queue and marks this frame as completed. When the driver gets an interrupt from the device confirming that the packet has been sent, it notifies the contract module via the send complete callback 33. This callback checks that the notification is not premature, i.e., the first frame in the transmit queue is marked as completed and pops the frame from the queue. By integrating the contract into the testbench we achieve more exhaustive driver testing, since the contract module 68 can observe both software and hardware events.

Device-class contracts 68 are subject to extension. Many devices support nonstandard features not covered by the existing contract. In such cases, a custom version of the contract must be produced for the device. In addition, the OS wrappers 78 also need to be modified to support the new behaviours. Such modifications will be strictly incremental in most cases, since non-standard devices are usually compatible with all features of the standard ones.

This example, being Example 1, produces a testbench and a Linux driver for an Ethernet controller device. The specific device used in this example is the OpenCores Ethernet MAC 10/100 Mbps controller whose RTL description is publicly available. The Ethernet controller device-class contract 68 and a driver functional layer 70 that adheres to this contract have been implemented. In order to test the driver functional layer 70 along with the device, a testbench is constructed as shown in FIG. 2. All components of the testbench 100, including the contract 68 and the device functional layer 70, are written in SystemVerilog.

In order to run the device functional layer 70 in the Linux environment, the necessary OS wrappers 78 and 82 for Linux are produced. The device functional layer 70 is translated from SystemVerilog to C.

This testbench helped find a number of defects in both the device functional layer 70 and the design under test. For one of the device functional layer 70 defects, we discovered an equivalent defect in the existing Linux driver 92 for the same device, which slipped through conventional driver testing. The problem occurs when the driver disables the device and immediately deallocates all associated DMA buffers. However, if the device is in the process of sending or receiving a packet, it does not stop its transmit and receive engines until the transfer is complete. Releasing DMA buffers while they are still in use can have severe consequences for OS security and integrity. The defect was identified by the contract module 68 when it received a tx frame notification from the PHY module (FIG. 3) indicating that the device was sending data after the device functional layer 70 had reported that the transmitter had been disabled. This example illustrates how the effectiveness of driver testing is improved by performing such testing in the testbench environment.

While contract-based testing is primarily intended to detect driver defects, it also found a number of hardware design defects missed by the original testbench provided with the device. Further analysis showed that this testbench did not model some situations that occur when the device is being used by the OS. For example the testbench only disabled the device when it did not have any queued data transfers, i.e., both the receive and the transmit buffer rings were empty. As a result, it missed a hardware race condition that occurred when the device was disabled with its receive ring not empty and later re-enabled, resulting in lost and corrupted packets. This illustrates the disconnect between hardware and software engineers: while software engineers often do not understand device internals enough to provide adequate software support for the device, hardware engineers are not familiar with the use patterns that the device must handle under software control. This example closes this gap to the benefit of both sides. Finally, we found that debugging a driver in the context of a testbench is much easier than debugging on real hardware. Driver developers frequently find themselves in situations when the device simply refuses to behave as expected. Often, the problem can only be solved by way of trial and error, which can be extremely frustrating and time consuming. The core issue here is that software has no way to inspect the internal state of the device to identify the cause of the misbehaviour. In contrast, in the testbench environment the programmer has complete access to the source code and the runtime state of the simulated device. On many occasions this helped us quickly locate problems that would have been very tricky to diagnose otherwise in the device driver.

Example 2

FIG. 5 shows the device-driver design workflow. This workflow is integrated into the hardware design and verification workflow. The workflow consists of the following tasks and the steps as performed by a computer system will be described:

Generic Interface Specification 200

This involves specifying the generic device-class interface 72, the generic bus transport interfaces 74, and the device-class contract 68. This task is carried out once for each device class and each bus type. The processor of a computer system receives at an input port electronic files representative of the interfaces 72 and 74. Alternatively, the computer system may operate to access the interfaces 72 and 74 stored in local or remote memory.

OS Framework Implementation 206

This involves implementing OS adaptation layer 78 and bus adaptation layer 82 for a particular OS and a particular device class or bus type. This task is carried out once for each OS and each device class or bus type. Again, the computer system by receive or access the OS adaption layer when requested.

Hardware Specification. 220

This involves producing a device specification 90 describing its external behaviour and internal architecture. This task is carried out for every device by the device vendor.

RTL Design 224

This involves the development of a synthesisable model of the device in an HDL, such as Verilog or VHDL. This task is carried out for every device by the device vendor's RTL design team.

Testbench Design 202, 204

This involves implementing a device testbench, including designing a functional layer 70 using the contract 68. This task is carried out for each device by the device vendor's verification team.

RTL Verification 226

This involves testing the RTL design along with the functional layer 70 using the testbench and eliminating any defects discovered in the process. This task is carried out in collaboration by the verification and the RTL design teams.

Driver Synthesis 208, 210

The computer system operates to access or receive the functional layer 70 developed as part of the testbench 100 and combine it with the OS adaptation layer 78 and the bus adaptation layer 82 for a particular OS in order to construct a driver 92 for the given OS.

The driver synthesis task involves the computer system further operating to translate the functional layer 70 into a programming language supported by the OS. The functional layer 70 is originally developed by the verification team at step 202 using an HDL such as SystemVerilog. Most current OSs are written in C or C++ and only support device drivers developed using the same language. In order to reuse the functional layer 70 as part of the device driver, it must be translated into the programming language supported by the OS where the driver will be used. In this example this translation is performed automatically.

Example 3

A variation of the flow shown in FIG. 5 is shown in FIG. 6, where the same steps are marked with the same reference numbers. However, in FIG. 6 the step of developing 250 the functional layer 70 is defined as a separate task that is performed before the testbench design 202, 204 task. This allows synthesising 208, 210 a driver 92 for the device before or concurrently with RTL design 224 and verification 226. This approach facilitates early system prototyping. Defects in the functional layer 70 are detected in the process of RTL verification 226, and task feedback 94 can be delivered to the functional layer implementation task 250 so as to create an improved functional layer 70 that can be used in further test bench design 202, 204 and driver synthesis 208, 210.

Example 4

Yet another variation of the flow shown in FIG. 5 is shown in FIG. 7, where the same steps are marked with the same reference numbers. However, FIG. 7 relates to devices that do not fall precisely into one of existing device classes. For example, many devices implement unique features that are not found in other similar devices. Supporting such features requires developing extensions 240 to produce extended generic device-class 72' and extended bus transport 73' interfaces. Also extensions 242 to produce an extended OS adaptation layer 78' and an extended bus adaptation layer 92'. To this end, the design workflow is modified to repeat tasks 200 and 206 on per-device basis. The modified workflow is shown in FIG. 7.

It will be appreciated by persons skilled in the art that numerous variations and/or modifications may be made to the invention as shown in the specific embodiments without departing from the scope of the invention as broadly described.

It should be understood that the techniques of the present disclosure might be implemented using a variety of technologies. For example, the methods described herein may be implemented by a series of computer executable instructions residing on a suitable computer readable medium. Suitable computer readable media may include volatile (e.g. RAM) and/or non-volatile (e.g. ROM, disk) memory, carrier waves and transmission media. Exemplary carrier waves may take the form of electrical, electromagnetic or optical signals conveying digital data steams along a local network or a publically accessible network such as the interne.

It should also be understood that, unless specifically stated otherwise as apparent from the following discussion, it is appreciated that throughout the description, discussions utilizing terms such as "constructing" or "processing" or "receiving" or "accessing" or "including" or "computing" or "executing" or the like, refer to the action and processes of a computer system, or similar electronic computing device, that processes and transforms data represented as physical (electronic) quantities within the computer system's registers and memories into other data similarly represented as physical quantities within the computer system memories or registers or other such information storage, transmission or display devices.

The present embodiments are, therefore, to be considered in all respects as illustrative and not restrictive.

The invention claimed is:

1. A device driver for a specific device comprising computer readable instructions stored on a non-transitory computer readable medium, the device driver comprising:
   a generic device interface to an operating system (OS) that defines the input/output and configuration operations that are supported by the specific device, wherein the generic device interface is independent of the OS and independent of the specific device; and
   a functional layer that implements the input/output and configuration operations defined by the generic device interface and is dependent on the specific device, wherein the functional layer is translated from a device-specific testbench, the device specific testbench verifying device transactions of the specific device to validate the design and implementation of the specific device.

2. The device driver according to claim 1, wherein the generic device interface is dependent on the class of devices that the specific device belongs to.

3. The device driver of claim 1, further comprising:
   a generic bus interface to a bus transport framework and functional layer that defines the methods of access to the bus framework, wherein the generic bus interface is independent of the OS.

4. The device driver of claim 3, wherein the generic bus interface is independent of the specific bus.

5. The device driver of claim 1 further comprising:
   an OS wrapper to interface to the operating system and the generic device interface that translates instructions between them.

6. The device driver of claim 1 further comprising:
   a bus wrapper to interface to a bus framework interface and the generic bus interface that translates instructions between them.

7. The device driver of claim 1 wherein the generic device interface is substantially the same as or a translation of the generic driver interface used in a testbench for the specific device.

8. The device driver of claim 3, wherein the generic bus interface is substantially the same as or a translation of the generic bus interface used in a testbench for the specific device.

9. A computer system comprising:
   a specific device;
   memory to store an executable version of the device driver of claim 1 for the specific device; and
   a processor to execute the executable version of the device driver to support the use of the specific device by the computer system.

10. A device specific testbench of a specific device comprising computer readable instructions stored on a non-transitory computer readable medium, the device-specific testbench verifying device transactions of the specific device to validate the design and implementation of the specific device, the testbench comprising:
    a generic device interface to an operating system (OS) that defines the input/output and configuration operations that are supported by the specific device, wherein the generic device interface is independent of the OS and independent of the specific device; and
    a functional layer that implements the input/output and configuration operations defined by the generic device interface and is dependent on the specific device, wherein the functional layer is verified by the testbench that verifies device transactions of the specific device and is translated into a functional layer usable by a device driver for the specific device.

11. The testbench of claim 10, further comprising a scenario layer which defines a valid sequence of requests that are made to the functional layer and corresponding correct responses to the requests, wherein the set of requests are independent of the specific device and dependent on the class of devices that the specific device belongs to.

12. A computer-implemented method performed by a processor for testing a design of a specific device in a device-specific testbench by executing computer readable instructions stored on non-transitory readable medium, the device-specific testbench verifying device transitions of the specific device to validate the design and implementation of the specific device, the method comprising:
    applying a sequence of requests to a functional layer that implements the input/output and configuration operations defined by a generic device interface of the specific device, wherein the
    functional layer is dependent on the specific device and is verified by the device-specific testbench that verifies device transactions of the specific device, wherein the functional layer is translated into a functional layer usable by a device driver for the specific device, and
    the generic device interface is independent of the operating system (OS) and independent of the specific device; and
    assessing the responses to the requests for correctness.

13. The method according to claim 12, wherein the requests are OS requests.

14. The method according to claim 12, wherein the requests are independent of the specific device and dependent on the class of devices that the specific device belongs to.

15. A computer-implemented method performed by a processor for constructing a device driver by executing computer readable instructions stored on non-transitory readable medium, the method comprising:
    receiving or accessing a generic device interface to an operating system (OS) that defines the input/output and configuration operations that are supported by the specific device, wherein the generic device interface is independent of the OS and independent of the specific device;
    receiving or accessing a functional layer that implements the input/output and configuration operations defined by the generic device interface and is dependent on the specific device, wherein the functional layer is translated from a device-specific testbench, the device-specific testbench verifying device transactions of the specific device to validate the design and implementation of the specific device; and
    constructing the device driver that includes the generic device interface and the functional layer.

16. The method of claim 15, wherein where the functional layer is not in the language suitable for use in the device driver, translating the functional layer to the appropriate language.

17. The method of claim 15, further comprising:
    receiving or accessing an updated functional layer based on results of tests on the functional layer in the testbench; and
    the constructing step further comprising including the updated functional layer in the device driver.

18. The method of claim 17, wherein results of tests on the functional layer are acquired by applying a sequence of requests to the functional layer; and assessing the response to the request for correctness.

* * * * *